(12) United States Patent
Takeguchi

(10) Patent No.: US 9,230,984 B1
(45) Date of Patent: Jan. 5, 2016

(54) THREE DIMENSIONAL MEMORY DEVICE HAVING COMB-SHAPED SOURCE ELECTRODE AND METHODS OF MAKING THEREOF

(71) Applicant: SANDISK TECHNOLOGIES INC., Plano, TX (US)

(72) Inventor: Naoki Takeguchi, Nagoya (JP)

(73) Assignee: SANDISK TECHNOLOGIES INC, Plano, TX (US)

( * ) Notice: Subject to any disclaimer, the term of this patent is extended or adjusted under 35 U.S.C. 154(b) by 0 days.

(21) Appl. No.: 14/501,539

(22) Filed: Sep. 30, 2014

(51) Int. Cl.
*H01L 27/115* (2006.01)
*H01L 27/088* (2006.01)
*H01L 23/532* (2006.01)

(52) U.S. Cl.
CPC ........ *H01L 27/11582* (2013.01); *H01L 27/088* (2013.01); *H01L 23/53209* (2013.01)

(58) Field of Classification Search
CPC ............. H01L 29/4916; H01L 23/53209; H01L 27/11582; H01L 27/11519; H01L 27/11556; H01L 27/11565; H01L 27/11573; H01L 27/11531; G11C 16/06; G11C 16/0483
USPC ........................................... 257/314, E27.06
See application file for complete search history.

(56) References Cited

U.S. PATENT DOCUMENTS 5,915,167 A    6/1999  Leedy
2011/0151667 A1*  6/2011  Hwang et al. ................. 438/667
2013/0126957 A1*  5/2013  Higashitani et al. .......... 257/314

OTHER PUBLICATIONS

Endoh et al., "Novel Ultra High Density Memory with a Stacked-Surrounding Gate Transistor (S-SGT) Structured Cell," IEDM Proc., (2001), 33-36.
U.S. Appl. No. 14/133,979, filed Dec. 19, 2013, SanDisk Technologies Inc.
U.S. Appl. No. 14/225,116, filed Mar. 25, 2014, SanDisk Technologies Inc.
U.S. Appl. No. 14/225,176, filed Mar. 25, 2014, SanDisk Technologies Inc.
U.S. Appl. No. 14/468,743, filed Aug. 26, 2014, SanDisk Technologies Inc.

* cited by examiner

*Primary Examiner* — Evan Pert
*Assistant Examiner* — Changhyun Yi
(74) *Attorney, Agent, or Firm* — The Marbury Law Group PLLC

(57) ABSTRACT

A monolithic three dimensional memory device includes a comb-shaped electrode within a trench, where the electrode includes an elongated continuous portion of an electrically conductive material that is raised from a major surface of a substrate and a plurality of second portions that include spaced-apart conductive pillars extending between the continuous portion and the major surface of the substrate. A fill material, such as a dielectric material, is located between the plurality of second portions.

28 Claims, 10 Drawing Sheets

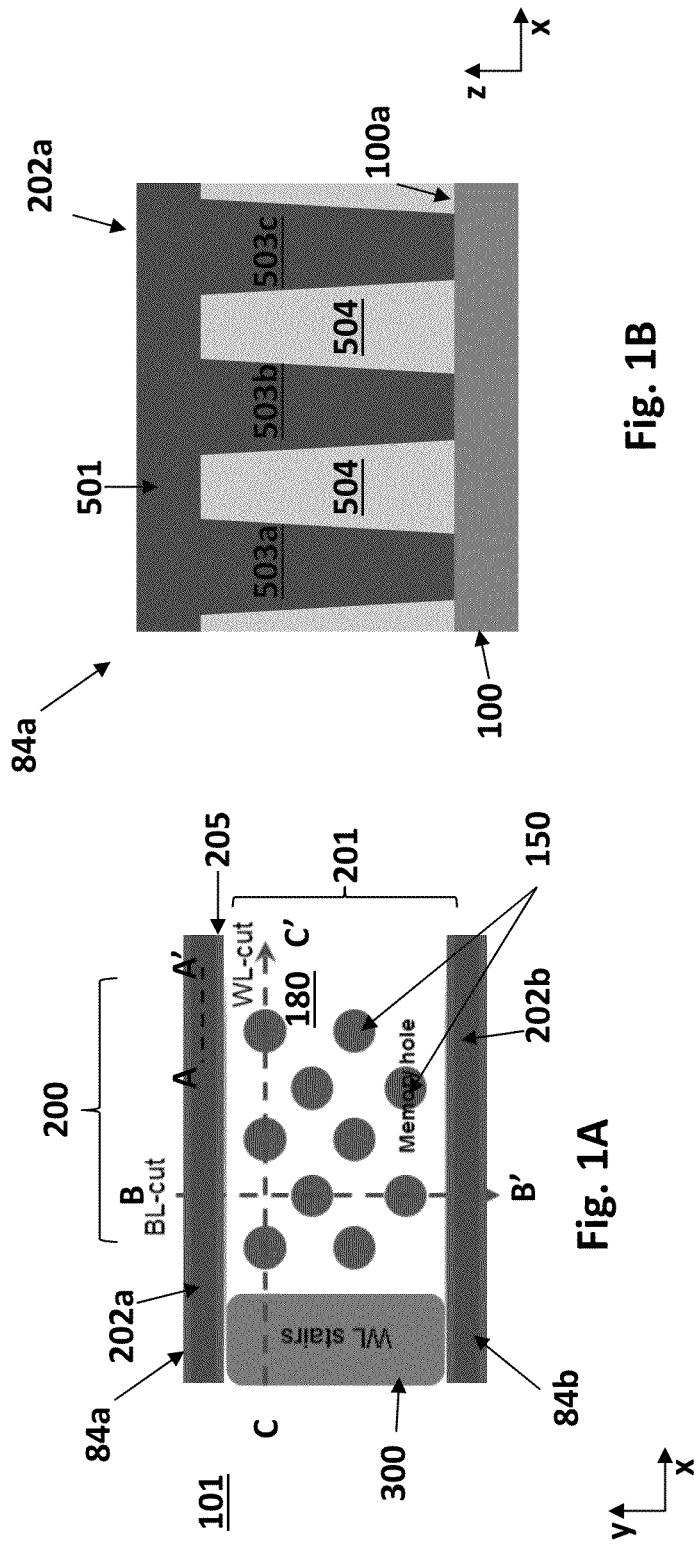

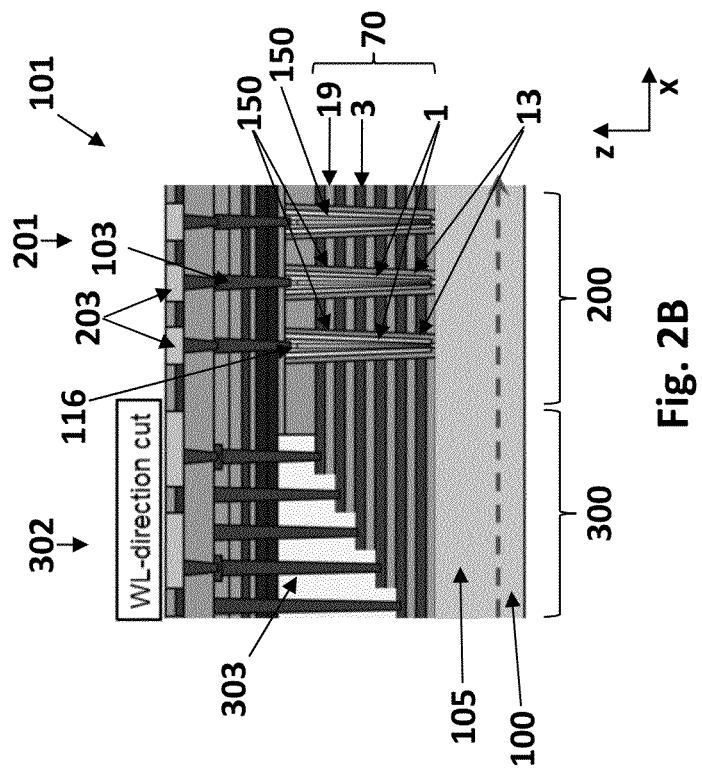
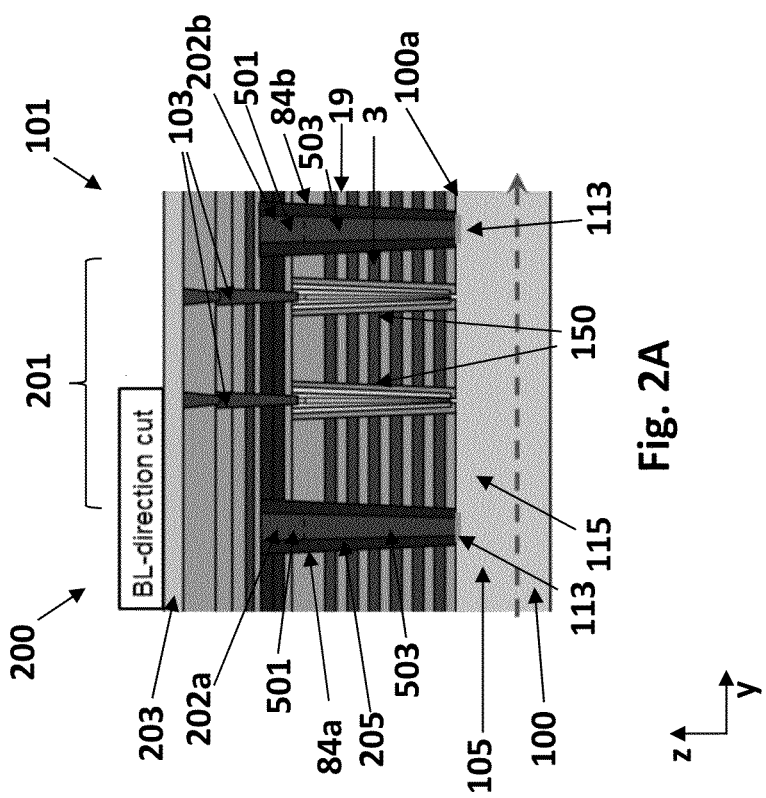
Fig. 2B
Fig. 2A

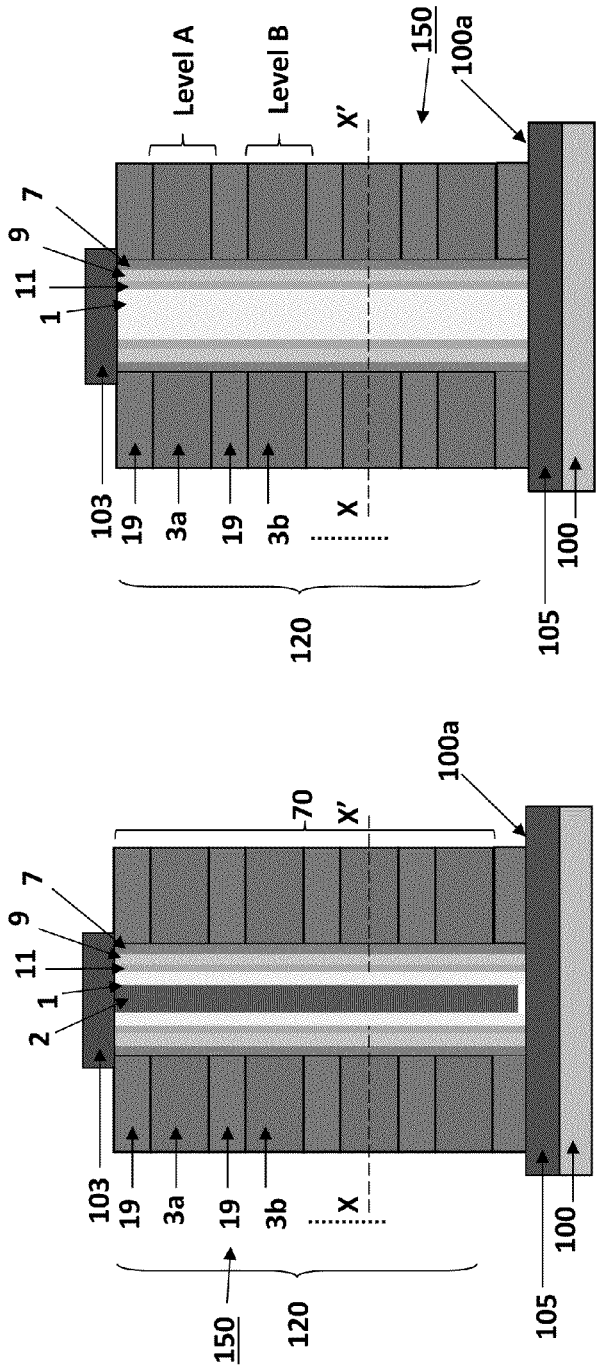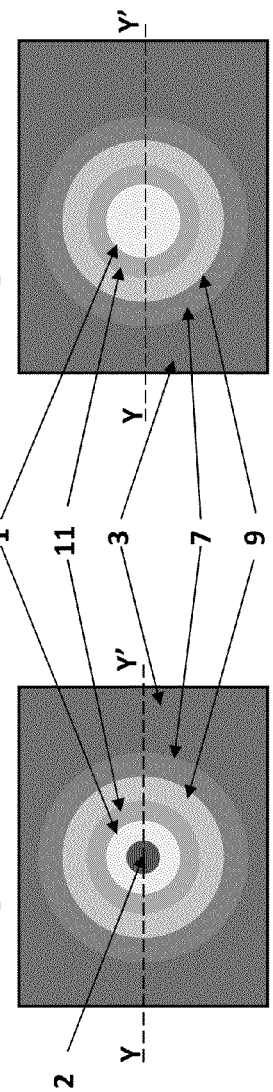

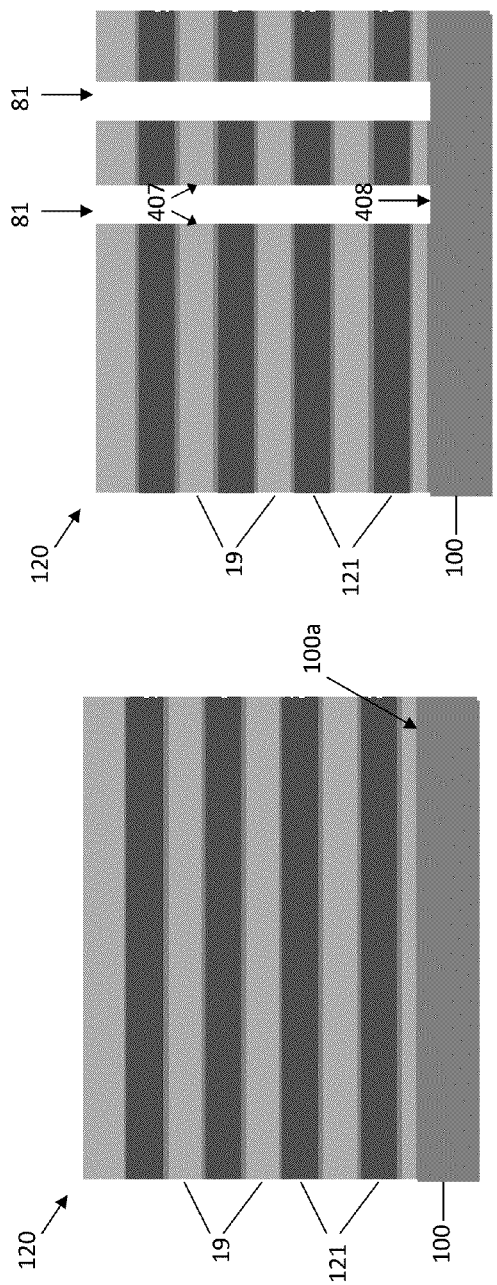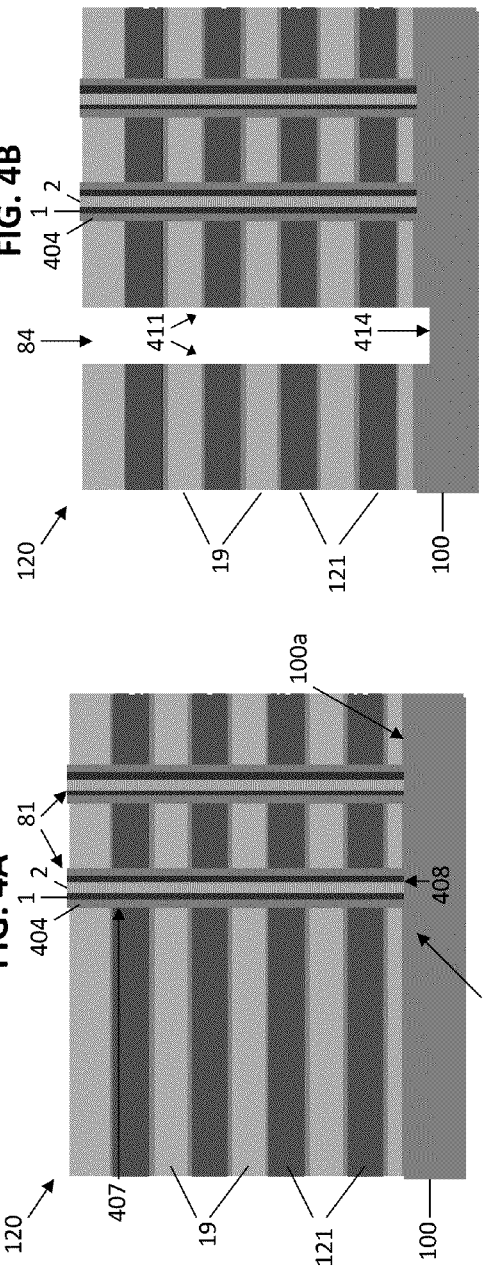

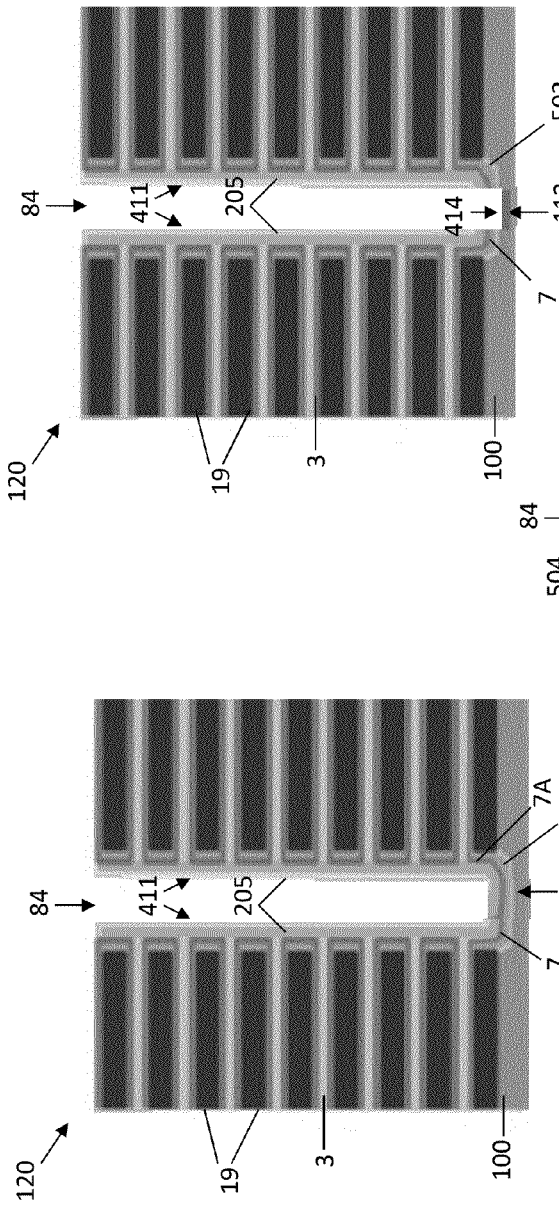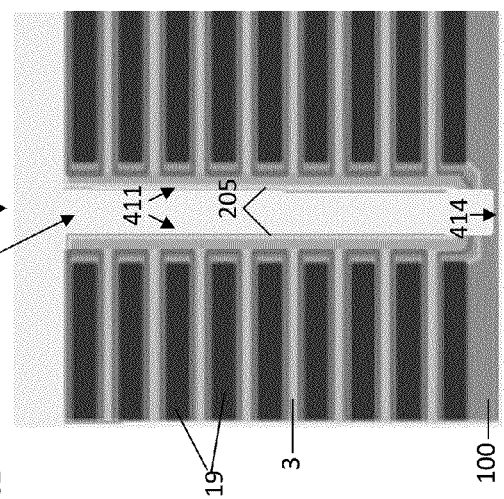

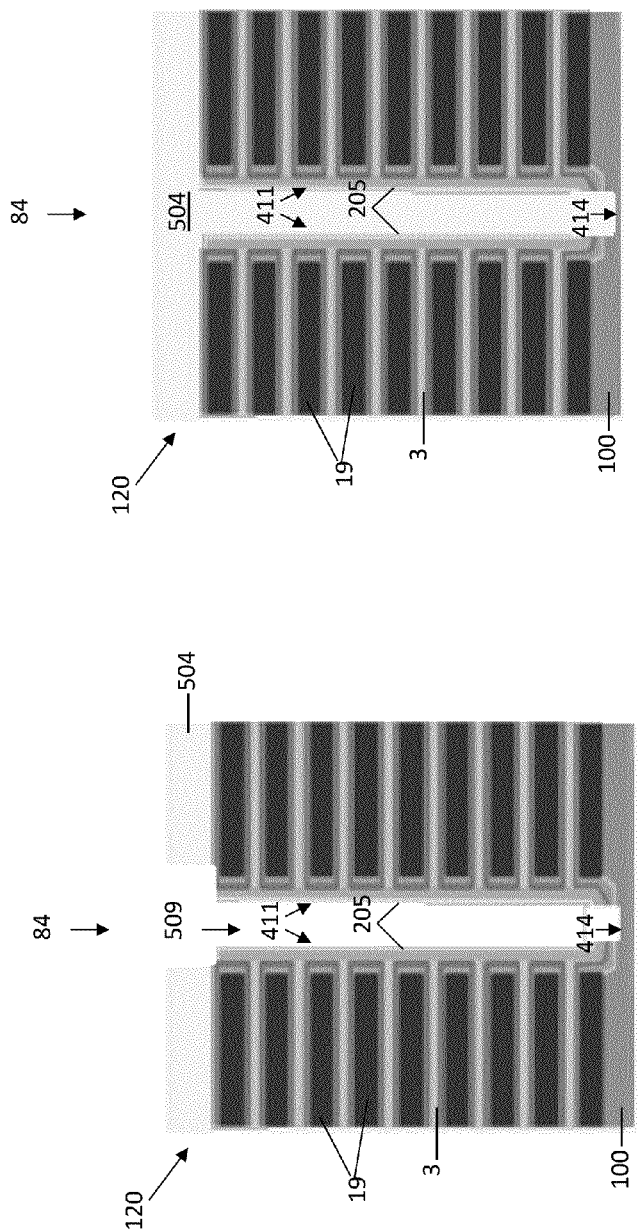
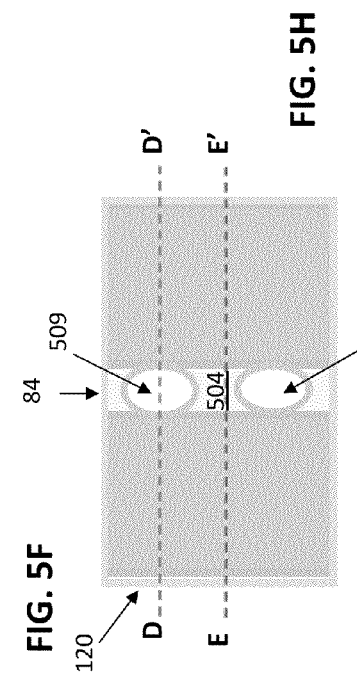
FIG. 5G
FIG. 5H
FIG. 5F

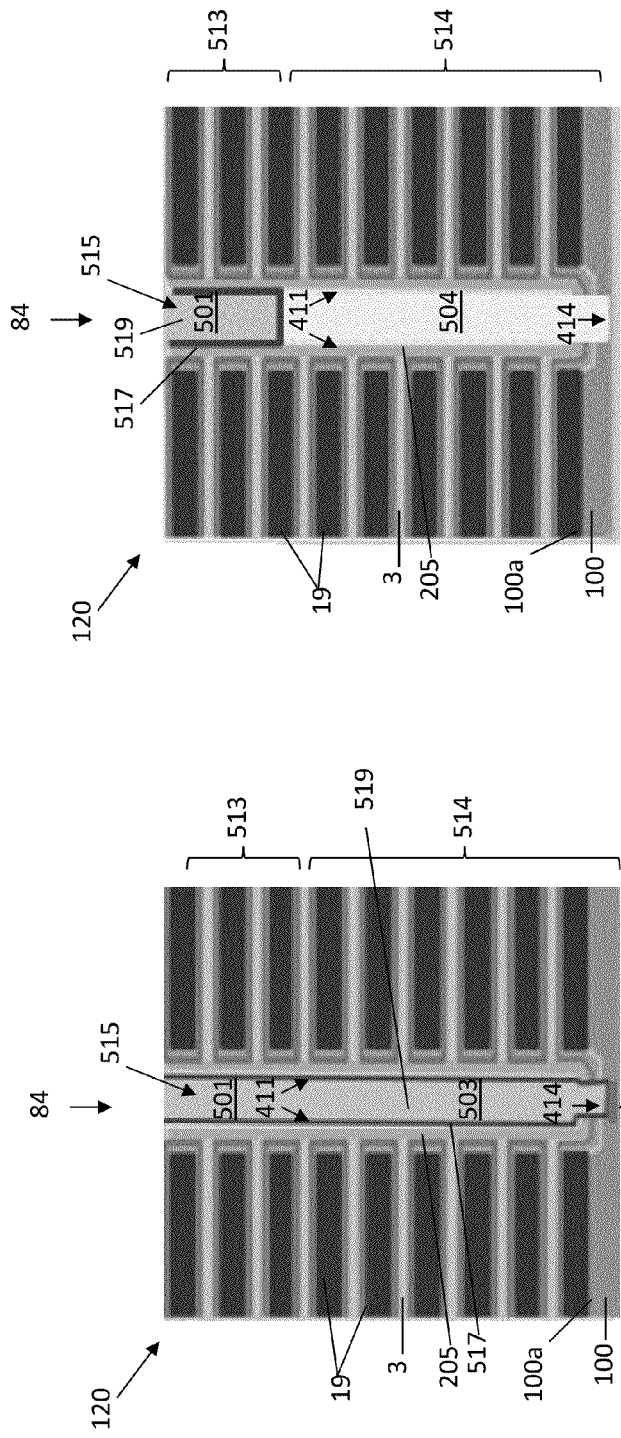
FIG. 5L
FIG. 5K
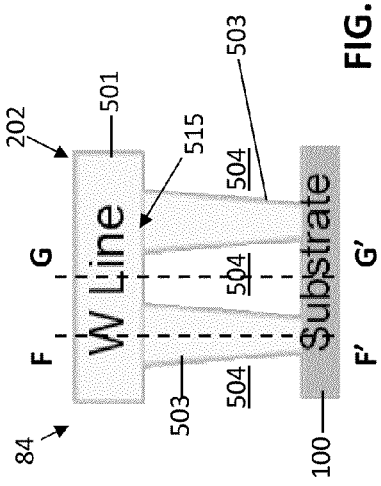
FIG. 5M

THREE DIMENSIONAL MEMORY DEVICE HAVING COMB-SHAPED SOURCE ELECTRODE AND METHODS OF MAKING THEREOF

FIELD

The present disclosure relates generally to the field of semiconductor devices and specifically to three dimensional memory devices, such as vertical NAND strings, and other three dimensional devices and methods of making thereof.

BACKGROUND

Three dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

An embodiment relates to a monolithic three dimensional memory device that includes a plurality of control gate electrodes extending substantially parallel to a major surface of a substrate, where the plurality of control gate electrodes includes at least a first control gate electrode located in a first device level and a second control gate electrode located in a second device level located over the major surface of the substrate and below the first device level, and an interlevel insulating layer located between the first control gate electrode and the second control gate electrode. The memory device also includes a plurality of semiconductor channels, where at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level, and at least one memory film is located between each of the plurality of control gate electrodes and each respective semiconductor channel of the plurality of semiconductor channels. The memory device also includes a trench extending substantially perpendicular to the major surface of the substrate, a first trench material located in the trench, where the first trench material includes a first potion that extends continuously within the trench in a first direction that is substantially parallel to the major surface of the substrate; and a plurality of second portions that extend from the first portion in a second direction that is substantially perpendicular to the major surface of the substrate and are spaced apart from one another along the first direction, and a second trench material located in the trench between the second portions of the first trench material.

Another embodiment relates to a method of making a monolithic three dimensional memory device that includes forming a stack of material layers over a major surface of a substrate, etching the stack to form a trench extending substantially perpendicular to the major surface of the substrate, forming a plurality of spaced-apart electrically conductive pillars having a major axis substantially perpendicular to the major surface of the substrate within the trench, where the electrically-conductive pillars are separated from one another by an electrically insulating fill material that at least partially fills the trench, and forming an electrically conductive layer within the trench contacting the plurality of pillars.

Another embodiment relates to a monolithic three dimensional NAND memory device that includes a silicon substrate, an array of monolithic three dimensional NAND strings having a plurality of device levels disposed above the silicon substrate, and a driver circuit associated with the array located above or in the silicon substrate. Each of the monolithic three dimensional NAND string of the array of monolithic three dimensional NAND strings includes a plurality of control gate electrodes extending substantially parallel to a major surface of a substrate, where the plurality of control gate electrodes includes at least a first control gate electrode located in a first device level and a second control gate electrode located in a second device level located over the major surface of the substrate and below the first device level, an interlevel insulating layer located between the first control gate electrode and the second control gate electrode, a plurality of semiconductor channels, where at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level, and at least one memory film located between each of the plurality of control gate electrodes and each respective semiconductor channel of the plurality of semiconductor channels. The array also includes at least one trench extending substantially perpendicular to the major surface of the substrate, the at least one trench filled with at least a first trench material and a second trench material, where the first trench material includes a first potion that extends continuously within the trench in a first direction that is substantially parallel to the major surface of the substrate and a plurality of second portions that extend from the first portion in a second direction that is substantially perpendicular to the major surface of the substrate and are spaced apart from one another along the first direction that is substantially parallel to the major surface of the substrate, and the second trench material is located between the second portions of the first trench material.

BRIEF DESCRIPTION OF THE DRAWINGS

FIG. 1A is a schematic top view of a memory device according to embodiments of the disclosure.

FIG. 1B is a side cross-section view of a memory device taken along line A-A' in FIG. 1A that shows a source electrode having a comb-shaped structure located within a trench.

FIG. 2A is a side cross-sectional view of a portion of a memory device in the bit line direction taken along line B-B' in FIG. 1A.

FIG. 2B is a side cross sectional view of a portion of a memory device in the word line direction taken along line C-C' in FIG. 1A.

FIGS. 3A and 3B are respectively side cross sectional and top cross sectional views of a NAND string of one embodiment. FIG. 3A is a side cross sectional view of the device along line Y-Y' in FIG. 3B, while FIG. 3B is a side cross sectional view of the device along line X-X' in FIG. 3A.

FIGS. 3C and 3D are respectively side cross sectional and top cross sectional views of a NAND string of another embodiment. FIG. 3C is a side cross sectional view of the device along line Y-Y' in FIG. 3D, while FIG. 3D is a side cross sectional view of the device along line X-X' in FIG. 3C.

FIGS. 4A-4F illustrate schematic side cross sectional view of steps in a method of making a NAND string memory device according to one embodiment.

FIGS. 5A-5M illustrate schematic side cross sectional (FIGS. 5A-5D, 5F, 5G and 5I-5M) and top cross-sectional (FIGS. 5E and 5H) views of steps in a method of making a NAND string memory device having a source electrode having a comb-shaped structure located within a trench according to one embodiment.

DETAILED DESCRIPTION

Figure 4F:
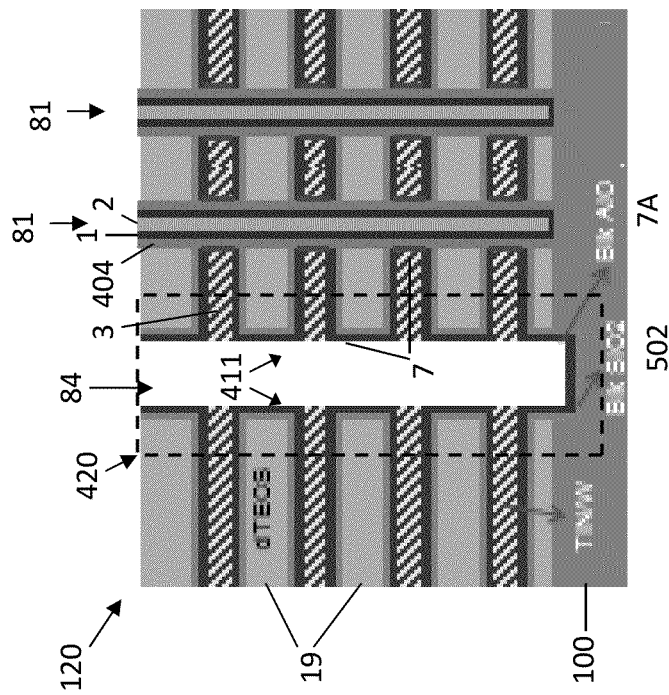

Embodiments of the present disclosure will be described below with reference to the accompanying drawings. It should be understood that the following description is intended to describe various embodiments of the disclosure, and not to limit the disclosure.

The embodiments of the disclosure may provide a monolithic, three dimensional array of memory devices, such as an array of vertical NAND strings. The NAND strings may be vertically oriented, such that at least one memory cell is located over another memory cell. The array may allow vertical scaling of NAND devices to provide a higher density of memory cells per unit area of silicon or other semiconductor material.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

FIG. 1A is a schematic top view of a memory device 101 according to an embodiment of the disclosure. FIG. 1B is a side cross-section view along line A-A' in FIG. 1A. FIGS. 2A-2B are side cross sectional views of portions of the memory device 101. FIG. 2A is a side cross sectional view of the memory device 101 in the bit line (i.e., y axis) direction taken along line B-B' in FIG. 1A. FIG. 2C is a side cross-sectional view of the memory device 101 in the word line (i.e., x-axis) direction taken along line C-C' in FIG. 1B.

In various embodiments, the memory device 101 may include at least one trench 84 extending substantially perpendicular to the major surface 100a of a semiconductor substrate 100, and an electrode 202 (e.g., source line) may be located in the trench 84. The electrode 202 may include a first potion 501 that extends continuously in a first direction (e.g., the x-axis or word line direction in FIGS. 1A-2B) that is substantially parallel to the major surface 100a of the substrate 100. The first portion 501 may comprise a layer of electrically conductive material and may have an elongated rail-shaped (i.e., strip-shaped) structure. The electrode 202 may also include a plurality of second portions 503 (see 503a, 503b and 503c in FIG. 1B) that extend from the first portion 501 in a second direction (i.e., z-axis direction) that is substantially perpendicular to the major surface 100a of the substrate 100 and may be spaced apart from one another along the first (i.e., x-axis) direction. Each of the plurality of second portions 503 may comprise a substantially pillar shaped structure of electrically conductive material having a major axis that is substantially perpendicular to the major surface 100a of the substrate 100. Each of the second portions 503 may electrically contact the major surface 100a of the substrate 100 at the bottom of the trench 84. Thus, when viewed in a side-cross section as shown in FIG. 1B, the electrode 202 according to this embodiment may resemble the shape of a comb, with the first portion 501 forming an elongated conductive material strip raised above the major surface 100a of the substrate 100 and the plurality of second portions 503 forming a series of conductive prongs or teeth extending from the first portion 501 and electrically contacting the major surface 100a of the substrate 100. A fill material 504 that is different from the electrically conductive material(s) of the first portion 501 and the second portions 503 may fill the trench 84 below the first portion 501 and may be located between each of the second portions 503 of the electrode 202, as shown in FIG. 1B. The fill material 504 may be an electrically insulating material (i.e., a dielectric material, such as silicon oxide, silicon nitride or silicon oxynitride).

As used herein, the first portion 501 is elongated in a first (e.g., x) direction when the first portion 501 has a length dimension along the first direction that is greater than the dimensions of the first portion 501 along respective second (e.g., z) and third (e.g., y) directions that are perpendicular to the first direction and to each other. As used herein, the first portion 501 may have a substantially "rail-shaped" structure when the first portion 501 has a cross-sectional shape that is substantially polygonal (e.g., rectangular, square, triangular, etc.), circular, oval or irregularly-shaped in a plane substantially perpendicular to the length dimension. The cross-sectional shape and/or area of the first portion 501 may be uniform or non-uniform along its length dimension.

In addition, as used herein, the second portion 503 has a substantially pillar shaped structure when the second portion 503 has a length dimension along the second (e.g., z) direction that is greater than the dimensions of the second portion 503 along respective first (e.g., x) and third (e.g., y) directions that are perpendicular to the second direction and to each other. In one embodiment, the second portion 503 may have a substantially-circular cross section shape in a plane substantially perpendicular to the second direction (e.g., substantially horizontal x-y plane) and to the major surface 100a of the substrate. The substantially pillar-shaped second portions 503 may have other cross-section shapes, such as ovoid, polygonal or irregular cross-section shapes. The cross-sectional shape and/or area of the first portions 503 may be uniform or non-uniform within a particular first portion 503 and/or across multiple first portions 503. As shown in FIG. 1B, for example, the first portions 503 may have a generally cylindrical shape with cross-sectional area that tapers between the first portion 501 and the major surface 100a of the substrate 100.

The conventional process for forming a source line electrode in a monolithic three dimensional NAND string memory device includes filling a trench with a conductive material to form a unitary plate-shaped electrode that is continuous in the trench within a plane (e.g., x-z plane) extending perpendicular to the major surface 100a of the substrate 100 (e.g., through line A-A' as shown in FIG. 1A). The inventors have discovered that this conventional plate-shaped electrode design can contribute to the problem of "bowing" of the substrate (e.g., silicon wafer) during fabrication of the monolithic three dimensional memory device. Bowing is undesirable because it negatively impacts processing and tool handling stability throughout numerous stages (e.g., lithography, etching, deposition) of the fabrication process. Further, this problem is made worse as the number of memory levels of the monolithic three dimensional memory device increases. In general, the greater the number of memory levels in the device, the higher the volume of the source line electrode(s) within the trench(es) and consequently the greater the degree of wafer bowing during the fabrication process. The degree of wafer bowing may generally increase in proportion to the number of memory levels (e.g., the height of the word line stack) over the substrate in the monolithic three dimensional memory device.

Various embodiments may include a monolithic three dimensional memory device that includes a comb-shaped electrode within a trench as described above and shown, for example, in FIG. 1B. A comb-shaped electrode structure according to various embodiments may include an elongated continuous portion 501 that is raised from the major surface 100a of the substrate 100 and a plurality of second portions 503 that may comprise spaced-apart conductive pillars that extend between the continuous portion 501 and the major surface 100a of the substrate 100. A fill material 504 (e.g., a dielectric material) may be located between the plurality of second portions 503. Thus, unlike in the conventional plate-shaped electrode as described above, the electrode may not be continuous in the trench within a plane extending substantially perpendicular to the substrate and may include spaced-apart conductive pillars that are separated by a fill material that is different from the electrode material. An electrode according to various embodiments may have a lower volume, a reduced contact area with the substrate and/or lower tensile stress forces compared to a conventional plate-shaped electrode, and may reduce bowing of the wafer during fabrication of the memory device. In addition, the location of the continuous portion 501 may be easily raised to accommodate a greater number of memory levels (e.g., an increase in the height of the word line stack) while maintaining electrical contact with the substrate 100 via the plurality of second portions 503. The inventors have discovered that using a comb-shaped electrode according to the various embodiments, the degree of wafer bowing may not increase in proportion to the number of memory levels in the device, unlike in the conventional plate-shape electrode design.

As shown in FIGS. 1A-2B, the memory device 101 may include at least one peripheral region 300 and at least one device region 200 adjacent to the at least one peripheral region 300. The memory device 101 may be a monolithic three dimensional memory device that may be formed over a major surface 100a of a semiconductor substrate 100 (e.g., silicon substrate), as shown in FIGS. 2A-2B. The memory device 101 may comprise a plurality of electrically conductive electrodes 202 (i.e., source line electrodes 202a, 202b) which may be elongated in a first (i.e., x-axis) direction substantially parallel to the major surface 100a of the substrate 100. The source lines 202 may be located within insulated slit trenches 84 as shown in FIGS. 1A and 2A. The source lines 202 may be spaced apart from one another along the y-axis (e.g., bit line) direction and extend parallel to one another in the x-axis (e.g. word line) direction, as shown in FIGS. 1A and 2A. Active memory cell areas 201 (e.g., memory blocks) may be located in the device region 200 between pairs of source lines 202, as shown in FIGS. 1A and 2A. Although a single active memory cell area 201 is shown in FIGS. 1A and 2A, it will be understood that a memory device 101 may include a plurality of active memory cell areas 201, where each active memory cell area 201 may be located between a pair of trenches 84 where at least one trench 84 includes an electrically conductive source line electrode 202. Each of the electrodes 202 may include a continuous first portion 501 that extends within the trench in a first (i.e., x-axis) direction and a plurality of second portions 503 which may be spaced apart in the first (i.e., x-axis) direction as shown in FIGS. 1B and 2A.

Each of the active memory cell areas 201 may contain an array 180 of vertical NAND strings 150 according to one embodiment of the disclosure. Each NAND string may comprise a substantially pillar-shaped structure extending substantially perpendicular to the major surface 100a of the substrate 100 and may include a plurality memory device levels, as shown in FIG. 2B. One or more driver circuits associated with the array 180 may be located above or in the substrate (e.g., a silicon substrate). Each NAND string 150 may contain at least one memory film 13 which is located adjacent to a semiconductor channel 1 in the memory device levels 70, as shown in FIG. 2B. Specifically, the memory film 13 may be located between the semiconductor channel 1 and a plurality of control gate electrodes, which may each comprise or may be electrically continuous with an electrically conductive word line 3 that extends within each of the memory levels 70 as described below. The memory film 13 may include a tunnel dielectric 11, a charge storage region(s) 9 (e.g., a dielectric charge trapping layer or floating gates), and a blocking dielectric 7, as described below with reference to FIGS. 3A-3D.

In embodiments, the peripheral region 300 may include a word line connection region 302 containing a plurality of word line contacts 303 which contact respective stepped portions of the plurality of electrically conductive word lines 3, as shown in FIG. 2B. The word lines 3 may comprise a plurality of vertically separated fingers that may extend from a word line connection region 302 into an active memory cell area 201 (i.e., between a pair of source lines 202a, 202b), as shown in FIGS. 1A and 2B. Each word line 3 may extend in a different device level 70 adjacent to the plurality of vertical NAND strings 150 within the active memory cell area 201. A plurality of insulating layers 19 (i.e., interlevel insulting layers) may extend substantially parallel to the major surface 100a of the substrate 100 between the respective word lines 3. An insulating material 205 may extend adjacent to the source lines 202a, 202b in the slit trenches 84a, 84b and electrically insulate the source lines 202a, 202b from the respective word lines 3 in the active memory cell area 201, as shown in FIGS. 1A and 2A.

In embodiments, the substrate 100 may have a doped well region 105 of a first conductivity type extending substantially parallel to the major surface 100a of the semiconductor substrate 100, as shown in FIGS. 2A-2B. In embodiments, the doped well region 105 may comprise a p-well region. A source region 113 may be located at the bottom of each of the slit trenches 84a, 84b and may be in electrical contact with a respective source line 202a, 202b. The source regions 113 may comprise regions of the substrate 100 having an opposite conductivity type than the conductivity type of the doped well region 105 (e.g., the source region 113 may be n-type when the doped well region 105 is a p-well region). In embodiments, the source region 113 may be formed by implanting the substrate 100 through the trench 84 (e.g., via ion implantation) to provide the source region 113 of the substrate 100 having a second conductivity type opposite the first conductivity type of the doped well region 105 of the substrate 100. The source line 202 may then be formed in the trench 84 in electrical contact with the source region 113.

In embodiments, each of the source lines 202 (e.g., source side electrodes) may be electrically coupled via the source region 113 to the semiconductor channel 1 of the NAND strings 150 via a semiconductor channel portion 115 that extends substantially parallel to the major surface 100a of the substrate 100 (e.g., within the doped well region 105) and contacts the semiconductor channel 1 from below the device levels 70, as shown in FIG. 2A.

The memory device 101 may also include drain electrodes 103 which contact the semiconductor channel 1 of the NAND strings 150 via a drain region 116 from above the device levels 70, as shown in FIGS. 2A-2B. Bit lines 203 may extend above the device levels 70 in a direction that is substantially perpendicular to the source lines 202 and contact the drain electrodes 103.

In embodiments, the semiconductor channel of the NAND strings 150 may have a J-shaped pipe shape with the vertically-extending portion of the semiconductor channel 1 forming a wing portion of the J-shaped pipe shape semiconductor channel and the horizontally-extending semiconductor channel portion 115 forming a connecting portion of the J-shaped pipe shape semiconductor channel which connects to the wing portion. The drain electrode 103 may contact the drain region 116 in the vertically-extending first wing portion of the semiconductor channel 1 from above, and the source electrode 202 may comprise a comb shaped source electrode (e.g., as shown in FIG. 1B) which contacts the source region 113 in the horizontally-extending connecting semiconductor channel portion 115 from above.

FIGS. 3A-3D are side cross sectional (FIGS. 3A and 3C) and top cross sectional (FIGS. 3B and 3D) views of a monolithic three dimensional NAND string 150 according to embodiments. The NAND strings 150 may be located in one or more active memory cell areas 201 of the memory device 101, such as described above with reference to FIGS. 1A-2B.

In some embodiments, the monolithic three dimensional NAND string 150 comprises a semiconductor channel 1 having at least one end portion extending substantially perpendicular to a major surface 100a of a substrate 100, as shown in FIGS. 3A and 3C. "Substantially perpendicular to" (or "substantially parallel to") means within 0-10°. For example, the semiconductor channel 1 may have a pillar shape extending through a plurality of memory device levels 70 (e.g., Level A, Level B, etc. in FIG. 3C) and the entire pillar-shaped semiconductor channel in the memory device levels extends substantially perpendicularly to the major surface 100a of the substrate 100, as shown in FIGS. 3A and 3C. The channels 1 may be electrically connected to a first (e.g., drain) electrode 103 which is schematically illustrated in FIGS. 3A and 3C. The first (e.g., drain) electrode 103 may connect to the top of the channel 1. The bottom of the channel 1 may connect to a second (e.g., source) electrode 202 (e.g., a comb-shaped source line 202 in FIGS. 1A-1B and 2A, not shown in FIGS. 3A and 3C) via a horizontally-extending channel portion 115 which may be located in a doped well region 105 of the substrate 100. The NAND string 150 may further include drain-side and source-side select or access transistors (not shown in FIGS. 3A and 3C for clarity) which may be located above and below the memory levels 70 of the NAND string 150, respectively.

In some embodiments, the semiconductor channel 1 may be a filled feature, as shown in FIGS. 3C and 3D. In some other embodiments, the semiconductor channel 1 may be hollow, for example a hollow cylinder filled with an insulating fill material 2, as shown in FIGS. 3A and 3B. In these embodiments, an insulating fill material 2 may be formed to fill the hollow part surrounded by the semiconductor channel 1.

A memory device 101 may comprise a plurality of NAND strings 150 formed in a stack 120 of material layers over the substrate 100. The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recrystallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three dimensional NAND string further comprise a plurality of control gate electrodes 3, which may be continuous with the word lines 3 shown in FIGS. 2A-2B, above. The control gate electrodes/word lines 3 may be electrically separated from each other by a plurality of electrically insulating layers 19 forming a stack 120 of alternating control gate electrodes/word lines 3 and insulating layers 19. The control gate electrodes/word lines 3 may comprise a portion having a strip shape extending substantially parallel to the major surface 100a of the substrate 100. The plurality of control gate electrodes/word lines 3 comprise at least a first control gate electrode/word line 3a located in a first device level (e.g., device level A) and a second control gate electrode/word line 3b located in a second device level (e.g., device level B) located over the major surface 100a of the substrate 100 and below the device level A. The material of the word lines/control gates 3 may comprise any one or more suitable conductive or semiconductor control gate material known in the art, such as doped polysilicon, tungsten, tungsten nitride, copper, aluminum, tantalum, titanium, cobalt, titanium nitride or alloys thereof or combination of these materials.

A blocking dielectric 7 may be located adjacent to the control gate(s) 3. For example, a straight blocking dielectric layer 7 may be located only adjacent to an edge (i.e., minor surface) of each control gate 3, as shown in FIGS. 3A and 3C. Alternatively, the blocking dielectric may surround the control gate 3, such as on the top, bottom and side surface of the control gate 3 facing the semiconductor channel 1.

The monolithic three dimensional NAND string may also comprise a charge storage region 9. The charge storage region 9 may comprise one or more continuous layers which extend the entire length of the memory cell portion of the NAND string, as shown in FIGS. 3A and 3C. For example, the charge storage region 9 may comprise an insulating charge trapping material, such as a silicon nitride layer. Alternatively, the charge storage region may comprise a plurality of discrete charge storage regions or segments 9 located between the blocking dielectric and the channel 1. The plurality of discrete charge storage regions 9 may comprise at least a first discrete charge storage region located in the device level A and a second discrete charge storage region located in the device level B. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments. Alternatively, the charge storage region 9 may comprise conductive nanoparticles, such as metal particles, for example ruthenium nanoparticles.

The tunnel dielectric 11 of the monolithic three dimensional NAND string is located between charge storage region 9 and the semiconductor channel 1.

The blocking dielectric 7 and the tunnel dielectric 11 may be independently selected from any one or more same or different electrically insulating materials, such as silicon oxide, silicon nitride, silicon oxynitride, or other insulating materials, such as metal oxide materials, for example aluminum oxide or hafnium oxide. The blocking dielectric 7 and/or the tunnel dielectric 11 may include multiple layers of silicon oxide, silicon nitride and/or silicon oxynitride (e.g., ONO layers).

An embodiment method of making a NAND string array 180 is illustrated in FIGS. 4A-4E and 5A-5M. In this embodiment, a plurality of spaced-apart electrically conductive pillars 503 having a major axis substantially perpendicular to the major surface of the substrate are formed within a backside opening 84 (i.e., a trench) formed through a material layer stack 120, where the electrically-conductive pillars 503 are separated from one another by an electrically insulating fill material 504 that at least partially fills the trench 84, and an electrically conductive layer 501 is formed within the trench 84 and electrically contacting the pillars 503. The conductive layer 501 and the conductive pillars 503 within the back side opening/trench 84 may form a substantially comb-shaped electrode (e.g., source-side electrode) for a NAND string memory device, such as described above in connection with FIGS. 1A-2B.

FIGS. 4A-4E are side cross-sectional views illustrating the formation of a portion of a NAND string array 180 (e.g., such as shown in FIGS. 2A and 2B). As illustrated in FIG. 4A, the method includes forming a stack 120 of alternating first material layers 19 and second material layers 121 over a major surface 100a of substrate 100. The second material is different from the first material. The layers 19, 121 may be formed by a suitable deposition method, such as sputtering, CVD, PECVD, MBE, ALD, etc. The layers 19, 121 may be 6 to 100 nm thick.

In one embodiment, the first material layers 19 comprise an electrically insulating material, such as an oxide (e.g., silicon oxide, silicon oxynitride, a high-k dielectric, etc.). The second material layers 121 may comprise a sacrificial material, such as an insulating material that is different from the material of the first layers 19. For example, layers 19 may comprise silicon oxide (e.g., formed using a tetraethyl orthosilicate (TEOS) source) and layers 121 may comprise silicon nitride forming an ONON stack 120. Alternatively, layers 19 may comprise silicon oxide and layers 121 may comprise polysilicon forming an OPOP stack 120.

The formation of layers 19, 121 may be followed by etching the stack 120 to form at least one front side opening 81 in the stack 120, as shown in FIG. 4B. An array of front side openings 81 (e.g., cylindrical memory openings or holes) may be formed in locations where vertical channels of NAND strings 150 will be subsequently formed.

The front side openings 81 may be formed by photolithography and etching as follows. First, a memory hole mask (not shown in FIGS. 4A-B) may be formed over the stack 120 and patterned to form openings corresponding to the future locations of the front side openings 81. The mask may comprise any suitable material, such as one or more layer of photoresist and/or hard mask material. Then, the stack 120 may be etched (e.g., using reactive ion etching (RIE)) to form at least one opening 81 in the stack as shown in FIG. 4B. In the embodiment of FIG. 4B, the etching may be stopped at the substrate 100. Alternatively, an etch stop layer may be formed over the substrate and the etching may be stopped on the etch stop layer. Following the etching to form the front side memory openings 81, the mask may be removed.

Each of the front side memory openings 81 may include a sidewall 407 defined by the exposed surfaces of the layers 19, 121 of the stack 120 and a bottom surface 408, which in this embodiment is defined by the exposed surface of the substrate 100.

Referring to FIG. 4C, at least one memory film 404 may be formed over the sidewalls 407 of the front side openings 81. The memory film 404 may include, for example, a charge storage material 9 and/or a tunnel dielectric layer 11 as described above in connection with FIGS. 2A-3D. The charge storage material 9 may be formed over at least a portion of the sidewall 407 of each of the front side openings 81, and the tunnel dielectric layer 11 may be formed on the charge storage material 9 over at least a portion of the sidewalls 407 of the front side openings 81. In some embodiments, the memory film 404 may also include a blocking dielectric 7. The blocking dielectric 7 may be formed over at least a portion of the sidewall 407 of each of the front side openings 81, and the charge storage material 9 and tunnel dielectric 11 may be formed over the blocking dielectric 7.

In embodiments, the memory film 404 may be formed over the stack 120 including over the sidewalls 407 and bottom surfaces 408 of each of the front side openings 81, and an anisotropic etching process (e.g., an RIE process) may be performed to remove the memory film 404 from the top surface of the stack 120 and from the bottom surface 408 of the front side openings 81, while the memory film 404 may remain over the sidewalls 407 of the front side openings 81. If the memory film 404 includes multiple layers of different materials (e.g., a blocking dielectric 7, charge storage material 9 and/or tunnel dielectric layer 11) the different materials may be selectively removed from the top surface of the stack 120 and/or the bottom surfaces 408 of the front side openings 81 during the same etching step or during different etching steps.

Referring again to FIG. 4C, a semiconductor channel 1 (e.g. a polysilicon or amorphous silicon layer) may be formed over the at least one memory film 404 along the sidewalls 507 of the front side openings 81. The semiconductor channel 1 may extend substantially perpendicular to the major surface 100a of the substrate 100, and at least a portion of the memory film 404 may be located between the semiconductor channel 1 and the sidewall 407 of the front side opening 81. The semiconductor channel 1 may contact the exposed surface of the substrate 100 at the bottom surfaces 408 of the front side openings 81, as shown in FIG. 4C. Optionally, the semiconductor channel 1 may contact a semiconductor channel portion of a lower (e.g., source-side) select gate transistor (not shown in FIG. 4C for clarity). The semiconductor channel portion of the lower select gate transistor may be formed as a protrusion extending from the major surface 100a of the substrate 100 or may be located within the semiconductor substrate 100, and may define the bottom surfaces 408 of the respective memory openings 81. The semiconductor channel portion of the lower select gate transistor may electrically couple the vertically-oriented semiconductor channel 1 extending within the front side opening 81 to a horizontal channel portion 412 located on or within the substrate 100 and extending substantially parallel to the major surface 100a of the substrate 100. Examples of suitable configurations and methods for making the lower (e.g., source side) select transistors of a monolithic three dimensional array of vertical NAND strings 150 are described, for example, in U.S. patent application Ser. No. 14/133,979, filed on Dec. 19, 2013, U.S. patent application Ser. No. 14/225,116, filed on Mar. 25, 2014, U.S. patent application Ser. No. 14/225,176, filed on Mar. 25, 2014, and U.S. Provisional Patent Application No. 61/977,173, filed on Apr. 9, 2014, all of which are incorporated by reference herein for all purposes.

An optional insulating fill material 2 (e.g., an oxide, such as silicon oxide) may be formed over the semiconductor channel 1 and fill the front side openings 81, as shown in FIG. 4C.

Referring to FIG. 4D, the stack 120 may be etched (e.g., through a mask patterned by photolithography, not shown in FIG. 4D) to form one or more back side openings (e.g., trenches) 84 in the stack 120. In this embodiment, the back side opening (e.g., trench) 84 extends through the entire stack 120 to the semiconductor substrate 100. The layers 19, 121 of the stack 120 may at least partially define the two opposed sidewalls 411 of the back side opening 84, and the substrate 100 may define the bottom surface 414 of the back side opening 84.

Figure 4E:
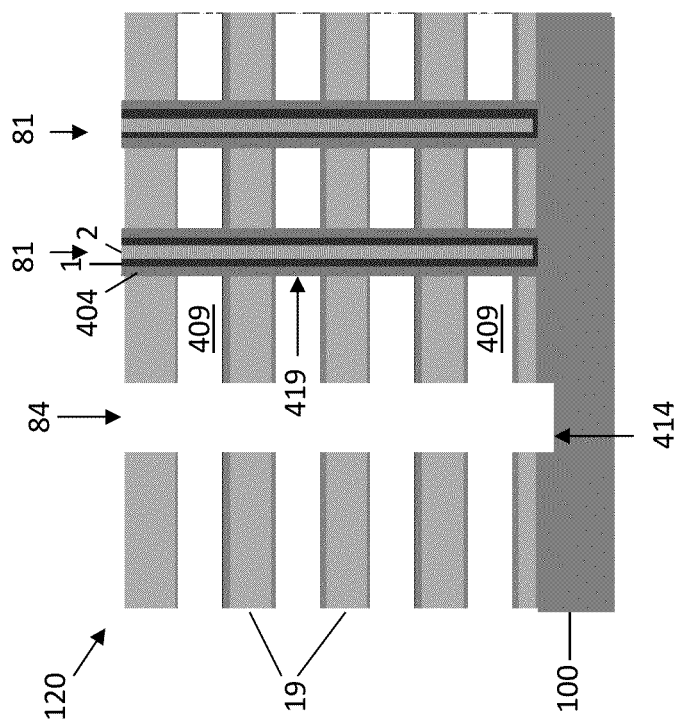

Referring to FIG. 4E, at least a portion of the second material layers 121 may be removed through the back side opening 84 to form back side recesses 409 between the first material layers 19. Layers 121 may be removed by selective etching, such as a silicon nitride selective etching (e.g., a hot phosphoric acid wet etch) which removes silicon nitride layers 121 but does not remove the silicon oxide material of layers 19.

Referring to FIG. 4F, a blocking dielectric 7 may optionally be formed in the back side recesses 409 through the back side opening 84. The blocking dielectric 7 may be formed over the exposed memory film 404 on the first side surfaces 419 of each of the back side recesses 409 (see FIG. 4E). The blocking dielectric 7 may also be formed adjacent to the first material layers 19 of the stack 120 on the top and bottom surfaces of each of the back side recesses 409. The blocking dielectric 7 may also be formed over the exposed minor surfaces of the layers 19 along the sidewalls 411 of the back side opening 84, and over the exposed surface of the substrate 100 on the bottom surface 414 of the back side opening 84.

Alternatively, the blocking dielectric 7 may be formed through the front side openings 81 (e.g., as part of the memory film 404, as described above with reference to FIG. 4C), and no blocking dielectric 7 may be formed in the back side recesses 409 through the back side opening 84. In some embodiments, the blocking dielectric 7 may be formed through both the front side openings 81 and the back side openings 84.

In embodiments, the blocking dielectric 7 may comprise a single layer or a stack of at least two layers of different insulating materials. For example, the different insulating materials may include silicon oxide, silicon nitride, silicon oxynitride and/or a high-k material such as $Al_2O_3$, $HfO_2$, $HfSiO$, $TaO_2$ or other metal oxides. In one embodiment, the blocking dielectric 7 may include a metal oxide material, such as aluminum oxide and/or hafnium oxide, and may comprise a stack comprising at least one layer of a metal oxide and at least one layer of an additional insulating material. For example, the blocking dielectric 7 may comprise a layer of aluminum oxide 7A and a protective layer of silicon oxide 502.

Referring again to FIG. 4F, control gate electrodes 3 may be formed in the back side recesses 409 through the back side opening 84. When a blocking dielectric 7 is present within the back side recesses 509, the control gate electrodes may be formed over the blocking dielectric 7 in the back side recesses 509. Each of the control gate electrodes 3 may be located in a respective device level (e.g., Level A, Level B, etc. as shown in FIGS. 2A-2B and 3A-3B) over the major surface 100a of the substrate 100.

Each of the control gate electrodes 3 may comprise one or more electrically conductive metal materials, including one or more metals or metal alloys, including metal nitrides and metal silicides. In one embodiment, the control gate electrodes 3 may be formed by depositing a metal nitride liner material (e.g., tungsten nitride (WN) or titanium nitride (TiN) liner, not shown in FIG. 4F) over the blocking dielectric 7 in the back side recesses 409, followed by depositing a metal (e.g., tungsten) over the metal nitride liner material to fill the back side recesses 409. Any of the metal and/or metal nitride liner material of the control gates 3 located in the back side opening 84 may be removed from the back side opening 84 (e.g., via one or more etching steps).

Figure 5D:
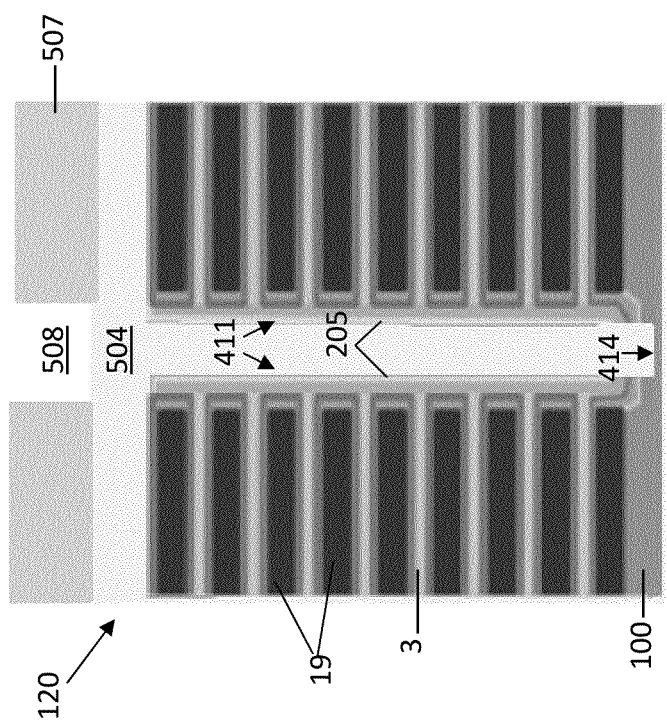

FIGS. 5A-5M illustrate schematic side cross sectional (FIGS. 5A-5D, 5F, 5G and 5I-5M) and top cross-sectional (FIGS. 5E and 5H) views of steps in a method of making a NAND string memory device having an electrode (e.g., source-side electrode) with a comb-shaped structure located within a back side opening/trench according to one embodiment. FIG. 5A is a side cross-sectional view of a portion of the stack 120 which substantially corresponds to the region 420 indicated by dotted lines in FIG. 4E. A layer of insulating material 205 may be formed over the sidewalls 411 and bottom surface 414 of the back side opening 84, as shown in FIG. 5A. The layer of insulating material 205 may insulate the back side opening 84 from the plurality of control gate electrodes 3 along the sidewalls 411 of the back side opening 84. In embodiments, the layer of insulating material 205 may comprise silicon nitride. In other embodiments, the layer of insulating material 205 may comprise silicon oxide or silicon oxynitride.

Referring to FIG. 5B, a portion of the layer of insulating material 205 located over the bottom surface 414 of the back side opening 84 may be removed by etching (e.g., using a directional etch, such as a reactive ion etch (RIE)). Additional layers which may optionally be located over the bottom surface 414 of the back side opening 84 (such as any blocking dielectric 7 (including a metal oxide layer 7A and/or a protective oxide layer 502) and/or control gate 3 material over the bottom surface 414) may be removed by etching (e.g., in the same or separate etching steps) to expose the substrate 100 on the bottom surface 414 of the back side opening 84. Methods for selective removal of materials, such as a blocking dielectric 7, from a back side opening 84 in a NAND memory device are described in U.S. patent application Ser. No. 14/468,743 filed on Aug. 26, 2014, the entire contents of which are incorporated herein by reference. In embodiments, the etching may expose a source region 113 that is located in or over the substrate 100. The source region 113 may comprise a doped region of the substrate 100 which may be implanted into the substrate through the back side opening 84.

Referring to FIG. 5C, an electrically insulating fill material 504 may be formed to at least partially fill the back side opening 84. As shown in FIG. 5C, the electrically insulating fill material 504 may completely fill the back side opening 84 and may also cover the top surface of the stack 120. The electrically insulating fill material 504 may comprise a suitable insulating material, such as at least one of silicon oxide, silicon nitride and silicon oxynitride. In embodiments, the electrically insulating fill material 504 may comprise silicon oxide comprising at least one of spin-on-glass (SOG), borosilicate glass (BSG) and silicon oxide formed using a tetraethyl orthosilicate (TEOS) source.

Figure 5E:
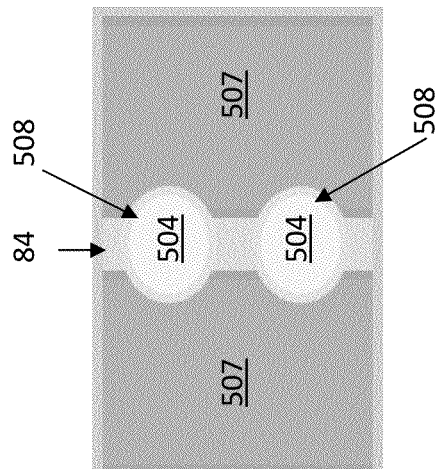

Referring to FIGS. 5D and 5E, a mask 507 may be formed over the insulating fill material 504 on the top of the stack 120 and the mask 507 may be patterned to form a plurality of spaced-apart openings 508. FIG. 5D is a side cross-section view of the stack 120 showing a mask 507 over the top of the stack 120, and FIG. 5E is a top view of the stack 120 (i.e., looking down at the mask 507) showing the spaced-apart openings 508 and the location of the back side opening (e.g., trench) 84 under the mask 507. Each of the openings 508 may expose an upper surface of the insulating fill material 504 that is located over the back side opening 84. The mask 507 may comprise any suitable mask layer, such as photoresist or a hard mask material, such as amorphous carbon (e.g., a so-called advance patterning film ("APF™")), silicon nitride, metal, etc., and may be patterned using photolithography.

Referring to FIGS. 5F-5H, the stack 120 may be etched (e.g., using reactive ion etching (RIE)) through the mask 507 to form a plurality of substantially pillar-shaped openings 509 in the insulating fill material 504 within the back side opening 84. FIG. 5H is a top view of the stack 120 showing the pillar-shaped openings 509 within the back side opening 84. FIG. 5F is a side cross-section view of the stack 120 taken along line D-D' of FIG. 5H, and FIG. 5G is a side cross-section view of the stack 120 taken along line E-E' of FIG. 5H. As shown in FIGS. 5F-5H, the openings 509 may be separated from one another by the insulating fill material 504. The etching may selectively remove portions of the insulating fill material 504 exposed through the openings 508 in the mask 507 to form openings 509 without removing the insulating fill material 504 under the mask 507 or other layers or materials from the stack 120. For example, as shown in FIG. 5F, the etching may remove the insulating fill material (e.g., silicon oxide) to expose the layer of insulating material 205 (e.g., silicon nitride) on the sidewalls 411 of the back side opening 84 within each of the substantially pillar-shaped openings 509. In the embodiment of FIGS. 5F-5H, the etching may be stopped at the substrate 100 (see FIG. 5F). In particular, the etching may expose the source region 113 that is located in or over the substrate 100, as described above in connection with FIG. 5B. Alternatively, an etch stop layer may be formed over the substrate and the etching may be stopped on the etch stop layer. Regions of the insulating fill material 504 that are not exposed through the mask 507 may be protected from etching and may remain in the back side opening 84, as shown in FIG. 5G. Following the etching to form the openings 509, the mask 507 may be removed as shown in FIGS. 5F-H.

Figures 5I, 5J:
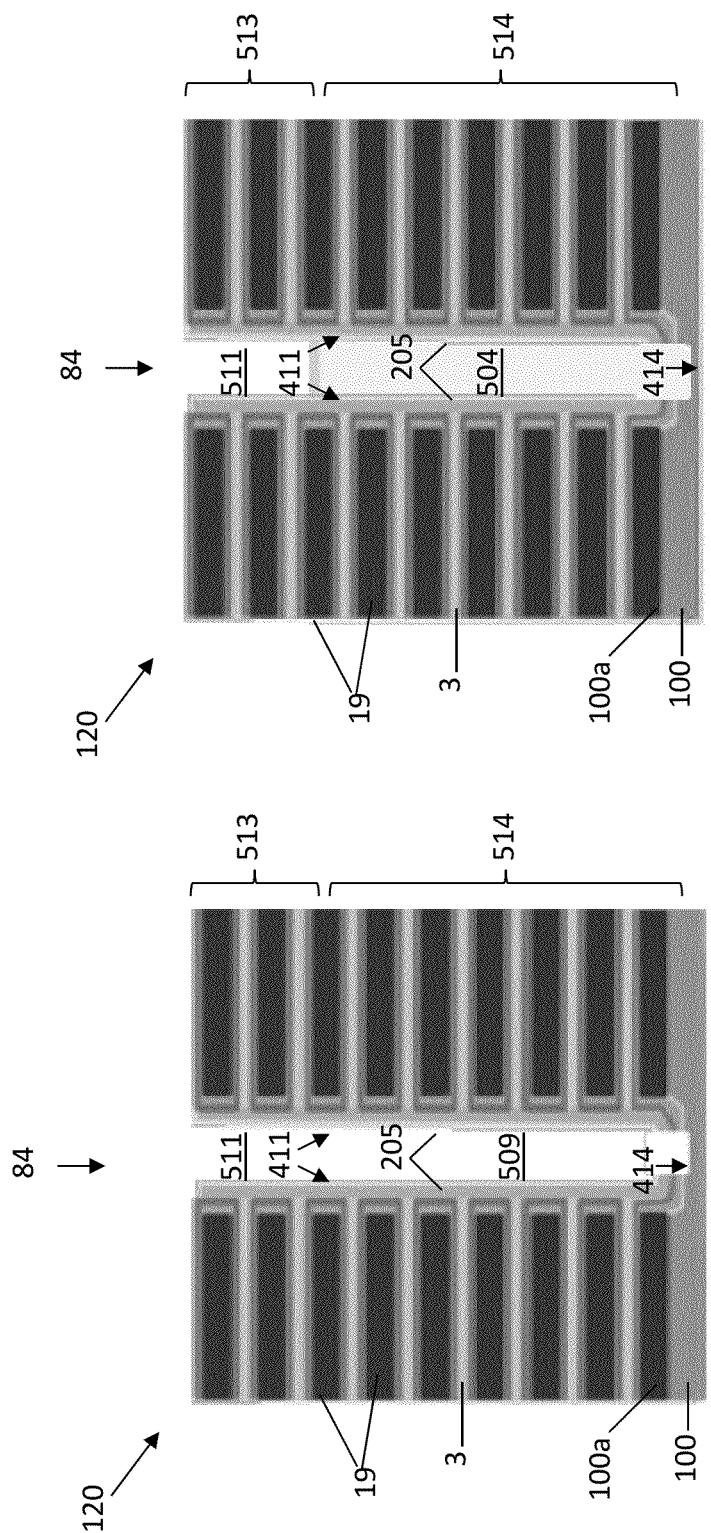

Referring to FIGS. 5I and 5J, following the removal of the mask 507, the stack 120 may be etched to remove the insulating fill material 504 from the top of the stack 120 and from an upper portion 513 of the back side opening 84 to provide a recessed portion 511 of the insulating fill material 504 within the back side opening 84. FIG. 5I is a side cross-section view of the stack 120 corresponding to FIG. 5F (i.e., taken along line D-D' of FIG. 5H) showing a pillar-shaped opening 509 and the insulating fill material 504 removed from the top surface of the stack 120. FIG. 5J is a side-cross section view of the stack 120 corresponding to FIG. 5G (i.e., taken along line E-E' of FIG. 5H) and shows the insulating fill material 504 removed from the top surface of the stack 120 and from the recessed portion 511 within the back side opening 84. As shown in FIG. 5J, the etching may remove a portion of the insulating fill material 504 from an upper portion 513 of the back side opening 84 (i.e., adjacent to a top end of the back side opening 84 distal to the major surface 100a of the substrate 100) to provide the recessed portion 511. The insulating fill material 504 may remain in a lower portion 514 of the back side opening 84 (i.e., adjacent to the major surface 100a of the substrate 100), as shown in FIG. 5J. The insulating fill material 504 in the lower portion 514 of the back side opening 84 may be located between the pillar-shaped openings 509.

Referring to FIGS. 5K-5M, an electrically conductive material 515 may be formed within the back side opening 84, including within the substantially pillar-shaped openings 509 in the insulating fill material 504 in the lower portion 514 of the back side opening 84, and within the recessed portion 511 in the upper portion 513 of the back side opening 84. The electrically conductive material 515 may comprise one or more materials such as a metal, metal alloy, metal nitride, metal silicide or heavily doped semiconductor material. In embodiments, the electrically conductive material 515 may include a first liner material 517 comprising a metal or metal nitride material and a second metal or metal alloy material 519 that is different from the first liner material. For example, the first liner material 517 may comprise a layer of titanium, tungsten nitride and/or titanium nitride material formed over the insulating fill material 504 and the second metal or metal alloy material 519 may comprise tungsten that is formed over the first liner material 517. Any electrically conductive material 515 that extends above the top surface of the stack 120 may be removed (e.g., using chemical mechanical polishing (CMP)) leaving the conductive material 515 within the back side opening 84, as shown in FIGS. 5K and 5L. FIG. 5K is a side cross section view of the stack 120 corresponding to FIGS. 5F and 5I (i.e., taken along line D-D' of FIG. 5H) and shows the electrically conductive material 515 filling a pillar-shaped opening 509 to form an electrically conductive pillar 503 within the back side opening 84. FIG. 5L is a side cross section view of the stack 120 corresponding to FIGS. 5G and 5J (i.e., taken along line E-E' of FIG. 5H) and shows the electrically conductive material 515 filling the recessed portion 511 of the insulating fill material 504 in the upper portion 513 of the back side opening 84. The insulating fill material 504 may remain in the lower portion 514 of the back side opening 84 between the electrically conductive pillars 503. FIG. 5M is a side-cross section view of the back side opening 84 in a plane that is rotated 90° from the views of FIGS. 5K and 5L, such that FIG. 5K is taken along line F-F' of FIG. 5M and FIG. 5L is taken along line G-G' of FIG. 5M. The electrically conductive material 515 may form an electrode 202 (e.g., a source side electrode) within the back side opening 84, such as described above in connection with FIGS. 1A-2B. The electrically conductive material 515 may form a continuous layer 501 of conductive material within the recessed portion 511 in the upper portion 513 of the back side opening 84 and a plurality of conductive pillars 503 in electrical contact with the continuous layer 501 and extending in the bottom portion 514 of the back side opening 84. The conductive pillars 503 may electrically contact the source region 113 of the substrate 100. The insulating fill material 504 may be adjacent to the conductive pillars 503, and may fill the back side opening 84 between the continuous layer 501 and the substrate 100.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three dimensional NAND memory device, comprising:
   a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level;
   an interlevel insulating layer located between the first control gate electrode and the second control gate electrode;
   a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level;
   at least one memory film located between each of the plurality of control gate electrodes and each respective semiconductor channel of the plurality of semiconductor channels;
   a trench extending substantially perpendicular to the major surface of the substrate;
   a first trench material located in the trench, the first trench material comprises:
      a first potion that extends continuously within the trench in a first direction that is substantially parallel to the major surface of the substrate; and
      a plurality of second portions that extend from the first portion in a second direction that is substantially perpendicular to the major surface of the substrate and are spaced apart from one another along the first direction; and
   a second trench material located in the trench between the second portions of the first trench material;
   wherein:
   the plurality of control gate electrodes comprise an electrically conductive material;
   the first trench material comprises an electrically conductive source electrode material contacting a source region in the substrate; and
   the second trench material comprises an electrically insulating material.

2. The monolithic three dimensional NAND memory device of claim 1, wherein the first portion of the first trench material comprises a substantially rail shaped structure that is elongated in the first direction that is substantially parallel to the major surface of the substrate.

3. The monolithic three dimensional NAND memory device of claim 2, wherein the plurality of second portions of the first trench material each comprise a substantially pillar-shaped structure having a major axis substantially perpendicular to the major surface of the substrate.

4. The monolithic three dimensional NAND memory device of claim 3, wherein the second trench material substantially fills the trench between adjacent second portions of the first trench material, and the second trench material is located between the first portion of the first trench material and the major surface of the substrate.

5. The monolithic three dimensional NAND memory device of claim 1, wherein:
   the plurality of control gate electrodes comprise at least one of tungsten and a tungsten alloy;
   the first trench material comprises at least one of tungsten and a tungsten alloy; and
   the second trench material comprises at least one of silicon oxide, silicon nitride and silicon oxynitride.

6. The monolithic three dimensional NAND memory device of claim 5, wherein the second trench material comprises silicon oxide comprising at least one of spin-on-glass (SOG), borosilicate glass (BSG) and silicon oxide formed using a tetraethyl orthosilicate (TEOS) source.

7. The monolithic three dimensional NAND memory device of claim 5, wherein the first trench material comprises a liner comprising at least one of a metal and a metal nitride material over an outer surface of the first trench material and at least one of a tungsten and a tungsten alloy material is located interior of the liner.

8. The monolithic three dimensional NAND memory device of claim 7, wherein the liner comprises at least one of titanium and titanium nitride.

9. The monolithic three dimensional NAND memory device of claim 1, wherein the trench further comprises an electrically insulating material located on walls of the trench to electrically insulate the plurality of control gate electrodes from the first trench material.

10. The monolithic three dimensional NAND memory device of claim 8, wherein the electrically insulating material located on the walls of the trench comprises silicon nitride.

11. A monolithic three dimensional NAND memory device, comprising:
    a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level;
    an interlevel insulating layer located between the first control gate electrode and the second control gate electrode;
    a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level;
    at least one memory film located between each of the plurality of control gate electrodes and each respective semiconductor channel of the plurality of semiconductor channels;
    a trench extending substantially perpendicular to the major surface of the substrate;
    a first trench material located in the trench, the first trench material comprises:
       a first potion that extends continuously within the trench in a first direction that is substantially parallel to the major surface of the substrate; and
       a plurality of second portions that extend from the first portion in a second direction that is substantially perpendicular to the major surface of the substrate and are spaced apart from one another along the first direction; and
    a second trench material located in the trench between the second portions of the first trench material;

wherein the semiconductor channel has a pillar shape and extends substantially perpendicular to the major surface of the substrate; and further comprising one of a source or drain electrode which contacts the pillar-shaped semiconductor channel from above, and another one of a source or drain electrode which contacts the pillar-shaped semiconductor channel from below.

12. A monolithic three dimensional NAND memory device, comprising:

a plurality of control gate electrodes extending substantially parallel to a major surface of a substrate, wherein the plurality of control gate electrodes comprises at least a first control gate electrode located in a first device level and a second control gate electrode located in a second device level located over the major surface of the substrate and below the first device level;

an interlevel insulating layer located between the first control gate electrode and the second control gate electrode;

a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level;

at least one memory film located between each of the plurality of control gate electrodes and each respective semiconductor channel of the plurality of semiconductor channels;

a trench extending substantially perpendicular to the major surface of the substrate;

a first trench material located in the trench, the first trench material comprises:

a first potion that extends continuously within the trench in a first direction that is substantially parallel to the major surface of the substrate; and a plurality of second portions that extend from the first portion in a second direction that is substantially perpendicular to the major surface of the substrate and are spaced apart from one another along the first direction; and a second trench material located in the trench between the second portions of the first trench material;

the semiconductor channel has J-shaped pipe shape;

a wing portion of the J-shaped pipe shape semiconductor channel extends substantially perpendicular to the major surface of the substrate and a connecting portion of the J-shaped pipe shape semiconductor channel which connects to the wing portion extends substantially parallel to the major surface of the substrate;

a source region and a drain region each contact the semiconductor channel;

a drain electrode contacts the drain region in the first wing portion of the semiconductor channel from above; and the first trench material comprises a comb shaped source electrode which contacts the source region in the connecting portion of the semiconductor channel from above.

13. A method of making a monolithic three dimensional NAND memory device, comprising:

forming a stack of material layers over a major surface of a substrate;

etching the stack to form a trench extending substantially perpendicular to the major surface of the substrate; and forming a plurality of spaced-apart electrically conductive pillars having a major axis substantially perpendicular to the major surface of the substrate within the trench, wherein the electrically-conductive pillars are separated from one another by an electrically insulating fill material that at least partially fills the trench;

forming an electrically conductive layer within the trench contacting the plurality of pillars;

wherein the monolithic three dimensional NAND memory device comprises:

a plurality of control gate electrodes extending substantially parallel to the major surface of a substrate, wherein the plurality of control gate electrodes comprises at least a first control gate electrode located in a first device level and a second control gate electrode located in a second device level located over the major surface of the substrate and below the first device level;

an interlevel insulating layer located between the first control gate electrode and the second control gate electrode;

a plurality of semiconductor channels, wherein at least one end portion of each of the plurality of semiconductor channels extends substantially perpendicular to the major surface of the substrate, such that at least one first portion of each of the plurality of semiconductor channels is located in the first device level, and at least one second portion of each of the plurality of semiconductor channels is located in the second device level;

at least one memory film located between each of the plurality of control gate electrodes and each respective semiconductor channel of the plurality of semiconductor channels;

the trench extending substantially perpendicular to the major surface of the substrate;

a first trench material located in the trench, the first trench material comprises:

a first potion which comprises the electrically conductive layer that extends continuously within the trench in a first direction that is substantially parallel to the major surface of the substrate; and a plurality of second portions which comprise the plurality of spaced-apart electrically conductive pillars that extend from the first portion in a second direction that is substantially perpendicular to the major surface of the substrate and are spaced apart from one another along the first direction; and a second trench material which comprises the electrically insulating fill material located in the trench between the second portions of the first trench material;

wherein:

the plurality of control gate electrodes comprise an electrically conductive material;

the first trench material comprises an electrically conductive source electrode material contacting a source region in the substrate; and the second trench material comprising an electrically insulating material.

14. The method of claim 13, wherein the electrically conductive layer extends parallel to the major surface of the substrate.

15. The method of claim 14, wherein the plurality of pillars and the electrically insulating fill material are located between the electrically conductive layer and the major surface of the substrate.

16. The method of claim 13, wherein the stack of material layers comprises an alternating plurality of first insulating material layers and second sacrificial material layers, and the method further comprising:

selectively removing at least a portion of the second sacrificial material layers through the trench to form a plurality of back side recesses between the first insulating material layers; and forming the plurality of control gate electrodes in the back side recesses through the trench prior to forming the plurality of conductive pillars within the trench.

17. The method of claim 16, further comprising:
forming an insulating layer on the sidewalls of the trench to electrically insulate the trench from the plurality of control gate electrodes prior to forming the plurality of conductive pillars within the trench.

18. The method of claim 17, wherein the insulating layer comprises a layer of silicon nitride that is formed over the sidewalls and a bottom surface of the trench, and the method further comprises:
etching the layer of silicon nitride to expose a source region in the substrate at the bottom surface of the trench while the layer of silicon nitride remains over at least a portion of the sidewalls of the trench.

19. The method of claim 17, further comprising:
forming the electrically insulating fill material within the trench to at least partially fill the trench; and
removing portions of the electrically insulating fill material to provide a plurality of substantially pillar shaped openings within the fill material, wherein the conductive pillars are formed within the substantially-pillar shaped openings.

20. The method of claim 19, wherein:
forming the electrically insulating fill material within the trench comprises filling the trench with the electrically insulating fill material and removing portions of the electrically insulating fill material comprises etching the fill material through a mask to provide the plurality of substantially pillar shaped openings within the fill material; and
a source region in the substrate is exposed in a bottom surface of each of the substantially pillar shaped support openings.

21. The method of claim 20, further comprising:
removing the mask; and
etching the electrically insulating fill material to provide a recessed portion of the fill material within the trench and adjacent to a top end of the trench that is distal to the major surface of the substrate.

22. The method of claim 21, wherein:
forming the electrically conductive pillars and the electrically conductive layer comprises forming an electrically conductive material within the trench, including within the recessed portion of the fill material and within the substantially pillar shaped openings within the fill material; and
the electrically conductive material contacts the source region in the substrate in the bottom surface of each of the substantially pillar shaped support openings.

23. The method of claim 22, wherein the electrically conductive material comprises at least one of a metal, a metal alloy, a metal silicide and a metal nitride.

24. The method of claim 22, wherein the electrically conductive material comprises a first liner material comprising at least one of a metal and a metal nitride material, and a second metal or metal alloy material that is different from the first liner material.

25. The method of claim 24, wherein the first liner material comprises at least one of titanium and titanium nitride, and the second metal or metal alloy material comprises tungsten.

26. The method of claim 23, wherein the electrically insulating fill material comprises at least one of silicon oxide, silicon nitride and silicon oxynitride.

27. The method of claim 26, wherein the electrically insulating fill material comprises silicon oxide comprising at least one of spin-on-glass (SOG), borosilicate glass (BSG) and silicon oxide formed using a tetraethyl orthosilicate (TEOS) source.

28. The method of claim 17, further comprising:
forming a plurality of memory openings in the stack; and
forming a plurality of memory films and the plurality of semiconductor channels in the respective plurality of memory openings, wherein at least one end portion of each of the plurality of semiconductor channels extends substantially perpendicular to the major surface of the substrate.

* * * * *